United States Patent [19]

Early et al.

[11] Patent Number: 4,629,910
[45] Date of Patent: Dec. 16, 1986

[54] HIGH INPUT IMPEDANCE CIRCUIT

[75] Inventors: Scott H. Early, Indianapolis, Ind.; Roger L. Minear, Wyomissing, Pa.

[73] Assignee: AT&T Bell Laboratories, Murray Hill, N.J.

[21] Appl. No.: 788,525

[22] Filed: Oct. 21, 1985

Related U.S. Application Data

[60] Continuation of Ser. No. 626,430, Jun. 29, 1984, abandoned, which is a division of Ser. No. 370,498, Apr. 21, 1982, Pat. No. 4,473,794.

[51] Int. Cl.[4] .................. H03K 3/33; H03K 5/08; H03K 17/687
[52] U.S. Cl. .................... 307/317 R; 307/540; 307/572; 307/564
[58] Field of Search .............. 307/270, 317 R, 296, 307/299, 297, 564, 540, 555, 571, 572

[56] References Cited

U.S. PATENT DOCUMENTS

| Re. 27,804 | 10/1973 | Treadway | 307/299 A |
|---|---|---|---|
| 3,262,065 | 7/1966 | Fredrickson | 330/24 |
| 3,365,546 | 1/1968 | Kemper | 179/1 |
| 3,458,828 | 7/1969 | Salman | 330/24 |
| 3,541,350 | 11/1970 | Luetze | 307/299 A |
| 3,846,696 | 11/1974 | Ahmed | 307/321 |
| 4,029,974 | 6/1977 | Brokaw | 307/296 R |
| 4,166,564 | 9/1979 | Ahmed | 307/270 |
| 4,251,742 | 2/1981 | Beelitz | 307/270 |

Primary Examiner—Stanley D. Miller
Assistant Examiner—B. P. Davis
Attorney, Agent, or Firm—Harry L. Newman; Samuel R. Williamson

[57] ABSTRACT

An integrated circuit amplifier for a high impedance microphone (100) of the capacitance type is disclosed. The subject amplifier circuit permits the further miniaturization of an electret microphone as it is capable of providing an input impedance simulating a resistor value of hundreds of megohms. The circuit particularly comprises duplicate coupling circuits (101a and 101b), a source of reference direct current voltage (103), and a gain providing circuit (102). The coupling circuits (101a and 101b) comprise a first pair of diodes (Q1 and Q2) symmetrically placed about one input terminal (IN1) of the microphone (100). Outputs of the reference voltage source (103) are provided to coupling circuits (101a and 101b) and through the coupling circuits to gain providing circuit 102. Such an arrangement facilitates power supply noise rejection and automatic canceling of direct current voltage drifts.

9 Claims, 4 Drawing Figures

INPUT BIASING CIRCUIT

HIGH INPUT IMPEDANCE CIRCUIT

This application is a continuation of application Ser. No. 626,430, filed June 29, 1984, now abandoned, which is a divisional of application Ser. No. 370,498 filed Apr. 21, 1982, now U.S. Pat. No. 4,473,794.

TECHNICAL FIELD

This invention relates generally to integrated circuits and more particularly, to an integrated circuit for simulating a high value resistor such as for use in an amplifier for amplifying the output of a high impedance microphone of the electret type.

BACKGROUND OF THE INVENTION

Gerhard M. Sessler and James E. West are generally credited with the discovery in 1962 that certain plastic dielectric materials can be employed to advantage in electret microphones. Their electret permanently retained electrostatic charge and provided sufficiently low output impedance to operate with then conventional transistor amplifiers.

A number of manufacturers since 1962 have commercially made available compact packages wherein a semiconductor amplifier and an electret microphone, in combination, provide an electrical signal in the audio frequency range.

In the movement toward further miniaturization of the electret microphone and amplifier combination, however, manufacturers have been impeded in their efforts to employ integrated circuit technology. The problem they have faced is that of applying integrated circuit technology to the generally high impedance (low capacitance) of small electret microphones. Also, it is especially useful for the integrated circuit amplifier to provide an overall gain to the output of the electret and provide an output impedance several orders of magnitude lower than the impedance of the electret.

SUMMARY OF THE INVENTION

These problems, and related problems of miniaturization of electret/amplifier combinations, are overcome by the present invention. The present invention overcomes the limitations of the prior art by employing an input coupling circuit comprising one or more forward-biased diodes driven by a low value constant current source, the combination providing an extremely high small-signal input resistance. The combination closely simulates a resistor whose resistance is far larger than the prior art has achieved on a silicon integrated circuit chip. Furthermore, no external biasing resistors or coupling capacitors are needed. The present invention thus permits the further miniaturization of an electret-amplifier combination.

DETAILED DESCRIPTION

Figure 1:
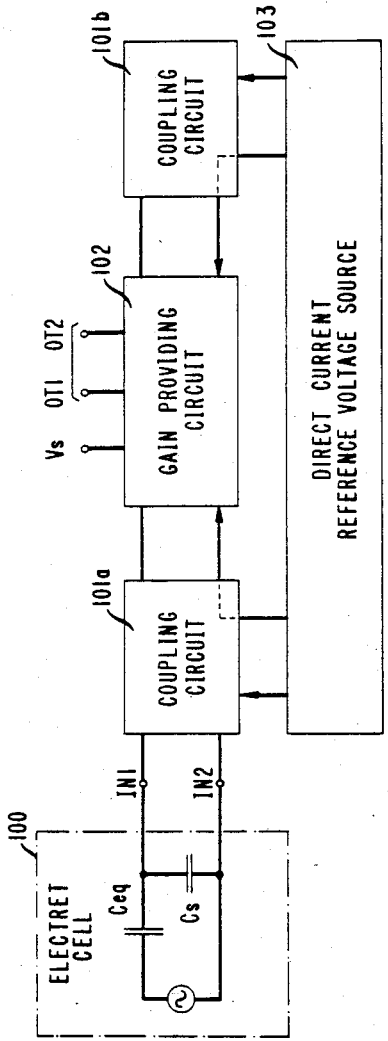
FIG. 1 is a block diagram of the present integrated circuit amplifier for a high impedance microphone of the capacitance type.

Referring to FIG. 1, a block diagram of the present integrated circuit amplifier for a high impedance microphone 100 of the capacitance type is shown. By high impedance microphone of the capacitance type, the specifications and claims are intended to refer to the use of the present invention with what are generally known in the art as electret microphones and with capacitance microphones, the latter differing from the former in that its dielectric is not permanently charged. The present integrated circuit amplifier comprises a coupling means comprising duplicate coupling circuits 101a and 101b for coupling to the high impedance microphone 100 of the capacitance type. Microphone 100 is most likely a miniature electret microphone housed in the same package as the present integrated circuit amplifier. The present integrated circuit amplifier also comprises a gain providing amplifier circuit 102 connected to the outputs of the coupling circuit. A reference source 103 direct current voltage biases diode circuits for the duplicate coupling circuits 101a and 101b and provides a reference DC voltage to the gain providing amplifier circuit 102.

Input coupling circuit 101a primarily serves an impedance conversion function. More particularly described in the discussion of FIG. 2, the coupling circuit 101a is capable of proximately simulating a resistor on the order of hundreds of megohms. Because the impedance of a capacitive microphone 100 varies with frequency, it is well known in the art that a coupling circuit for optimum performance should provide an impedance greater than the largest impedance provided by the capacitive microphone in the frequency band of interest.

With existent materials, there is a practical lower limit on the gap that can be constructed between charged elements of an electret. Thus, it is well known in the manufacture of electret microphones that as the area of the electret cell decreases, so does the capacitance presented. Accordingly, an electret significantly smaller than electrets currently available must exhibit a much smaller capacitance. Consequently, the optimal input impedance for an amplifier matching such an electret will be much greater. The present coupling circuit 101a provides an input resistance on the order of hundreds of megohms and an output resistance of the order of one to ten kilohms while providing a nearly unity signal voltage gain.

Coupling circuit 101a is entirely duplicated by coupling circuit 101b. In order to perfectly balance the electret cell 100, coupling circuit 101b comprises a capacitance value equivalent to the equivalent capacitance Ceq of the electret cell and the stray capacitance Cs of the connection. The perfectly balanced circuit alleviates power supply noise and other noise.

The coupling circuit 101a and 101b of the present invention are connected to the gain providing amplifier circuit 102. In combination with the coupling circuits, amplifier 102 provides an overall gain to the output of capacitive microphone 100, while reducing the source impedance to a considerably lesser value.

Figure 2:
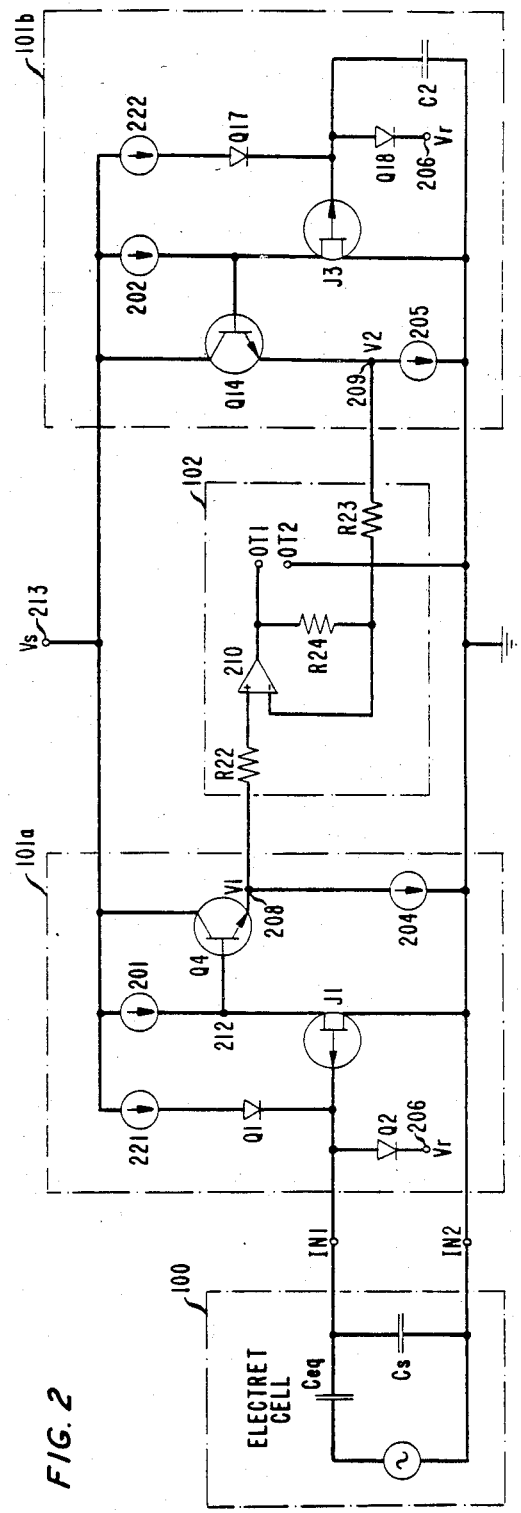
FIG. 2 is a simplified schematic drawing of one embodiment of the present integrated circuit amplifier particularly showing the duplicate coupling circuits.

Referring now to FIG. 2, a simplified schematic drawing of coupling circuits 101a and 101b of FIG. 1 is shown. Similar reference characters are employed in all figures wherever possible to identify similar elements.

Also, the first digit value of a reference character for an element identifies in what figure that element first appears. Power supply and element polarities may be reversed in this and subsequent figures, i.e., NPN for PNP transistors, N-channel field effect transistors are shown MOS field effect transistors may be likewise employed.

Coupling circuit 101a comprises input terminals IN1 and IN2 for connecting to capacitive microphone 100. At terminals IN1 and IN2, an extremely high input resistance is presented to the capacitive microphone circuit 100. In particular, a low value constant current source 221 is shown which comprises one element of an input biasing circuit more particularly described in the discussion of FIG. 3. The current source 221 is provided for driving diodes Q1 and Q2, symmetrically placed about input terminal IN1. Reference voltage source 103 provides a DC reference voltage Vr at node 206 for biasing diodes Q1 and Q2. The arrangement of the diodes Q1 and Q2, the current source 221, and the reference voltage at node 206 proximately simulate a resistor having a value on the order of hundreds of megohms.

Input terminal IN1 is also connected to the gate of a unipolar transistor J1. The unipolar transistor J1 is driven by a current source 201. Transistors J1 provides a first stage of impedance reduction and comprises a source which is connected to the base of a bipolar transistor Q4. The bipolar transistor Q4 is connected as an emitter follower for providing a second stage of impedance reduction, if required. It is biased by current source 204. Between transistor Q4 and current source 204 is node 208 which connects the coupling circuit to gain providing amplifier circuit 102.

The quiescent voltage at node 208 is controlled by direct current reference voltage source 103 (FIG. 1). The reference voltage Vr at node 206 is raised to a higher voltage by the anode to cathode drop over diode Q2. That higher voltage likewise appears at node 212 and is dropped in value by the emitter to base voltage of transistor Q4. As a result, the quiescent DC voltage V1 at node 208 directly tracks the reference voltage provided at node 206 by source 103.

As a result of the extremely high impedance at terminal IN1, the electrical signal output of microphone 100 is highly susceptible to noise and, in particular, to power supply noise at 213. To alleviate the noise and to reject its effects, duplicate coupling circuit 101b is provided. In particular, in order to duplicate the microphone 100, a capacitor C2 connects to symmetrical diodes Q17 and Q18 in a similar manner as microphone 100 is connected to diodes Q1 and Q2. The value of capacitor C2 should be chosen so as to simulate the equivalent capacitance Ceq and stray capacitance Cs of microphone 100. In effect, the duplicated combination of diodes Q17 and Q18, unipolar transistor J3 and bipolar transistor Q14 perfectly balance the impedance conversion circuit comprising diodes Q1 and Q2, unipolar transistor J1, and bipolar transistor Q4.

Reference voltage source circuit 103 (FIG. 1) provides reference voltage Vr at node 206 of coupling circuit 101b, the same node as is shown in coupling circuit 101a (FIG. 2). As a result of voltage Vr appearing at node 206, node 209 of duplicate coupling circuit 101b provides an approximately identical DC bias voltage V2 to gain providing amplifier circuit 102 as does node 208 of coupling circuit 101a. The voltage difference between nodes 208 and 209 is essentially the output AC signal voltage of the microphone 100. Thus noise entering at node 213, or DC voltage drifts appearing in both coupling circuits 101a and 101b, appear equally on nodes 208 and 209 as common mode input signals to amplifier 102. Such signals are thus not amplified by the operation of gain providing circuit 102.

Gain providing circuit 102 in simplified form comprises a Complimentary Bipolar Integrated Circuit (CBIC) operational amplifier 210. It is connected to node 208 by resistor R22 and to node 209 by resistor R23. The ratio of resistor R24 to resistor R23 controls the closed loop gain of the gain providing amplifier circuit 102. The amplified output signal of microphone 100 is provided at terminal OT1 with reference to ground terminal OT2. While a CBIC operational amplifier is suggested, other integrated circuit amplifiers known in the art may be substituted therefor, provided any necessary design changes are made to coupling circuits 101a and 101b.

Figure 3:
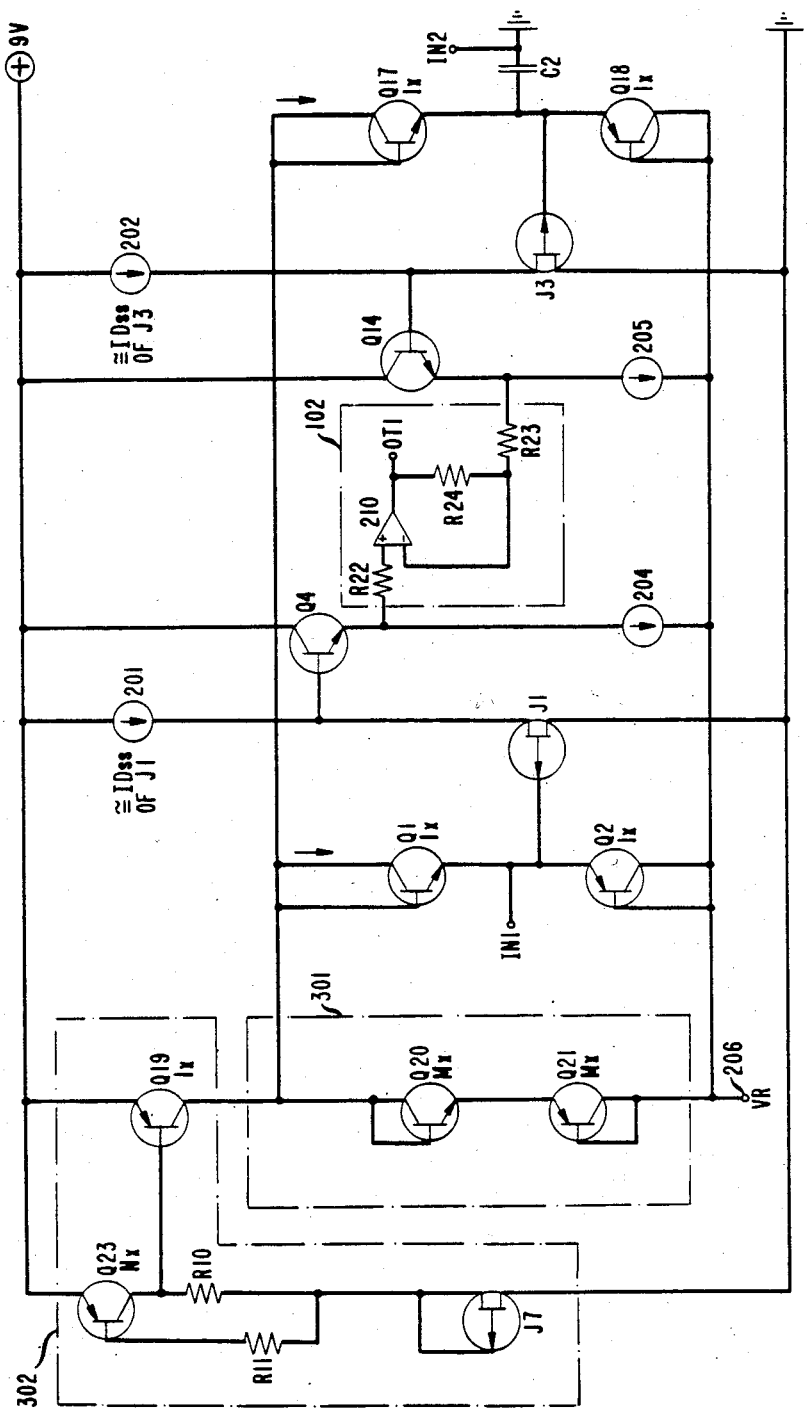
FIG. 3 is a detailed schematic drawing which particularly shows the input biasing circuit of the coupling circuits.

Referring to FIG. 3, a detailed schematic drawing of an input biasing circuit for coupling circuits 101a and 101b is shown. In particular, the input biasing circuit comprises a constant current source 302 and a diode circuit 301. Current source 302 and diode circuit 301 in combination are represented in FIG. 2 by current source 221 and 222. The diode circuit 301 comprises series-connected diodes Q20 and Q21 whose emitter junction areas are a multiple Mx of the emitter junction areas of diodes Q1, Q2, Q17, or Q18.

The current source 302 comprises first and second bipolar transistors Q23 and Q19, the emitter junction area of transistor Q23 being a multiple of that of transistor Q19. The collector of transistor Q19 drives the aforementioned diodes. Transistor Q23 is connected to resistances R10 and R11, which are in turn connected to unipolar transistor J7. The source and gate of transistor J7 are connected forming a two terminal current source. Resistor R10, the emitter area ratio of transistors Q23 and Q19, and the nominal drain saturation current Idss of transistor J7 provide a highly controlled collector current in transistor Q19, whose value is constant and insensitive to small variations in the current through transistor J7.

The present input biasing circuit provides protection from microphone overload. Diodes Q20 and Q21, like diodes Q1 and Q2, are connected between the reference voltage Vr at node 206 and constant current source 302, which forward biases all diodes.

The current I in an integrated circuit diode is given by $$I = J_o A_j \left(e^{\frac{qV}{kT}} - 1\right).$$

where Jo is a process dependent constant; Aj is the junction area; q is the electronic charge; V is the diode voltage; k is Boltzman's constant; and T is absolute temperature. (Note that kT/q at room temperature is approximately 25 millivolts.) Then the small-signal resistance of the diode under forward bias is given by $$R = \frac{dV}{dI} = \frac{kT}{qI}.$$

Thus, diodes fabricated with the same process, with the same applied voltage, and having different junction areas exhibit small-signal resistances which vary inversely with their junction areas.

If the FET gate currents are negligible, Q20 has an emitter junction area fifty times that of similarly fabricated diode Q1, and diodes Q21 and Q2 are similarly fabricated and area-ratioed, it follows that Q1 and Q2 will each exhibit a small-signal resistance fifty times that of Q20 and Q21.

One particular purpose of diodes Q1 and Q2 is to minimize the input capacitance presented to microphone 100 at terminal IN1. However, the symmetrical placement of first and second diodes Q1 and Q2 about input IN1, together with biasing diodes Q20 and Q21 provides a further advantage. Such a symmetrical diode arrangement provides progressive signal compression and limiting to voltage swings from the microphone of either polarity which are in excess of normal signal levels. This might occur, for example, when one taps the microphone, blows into it, or otherwise overloads it.

Figure 4:
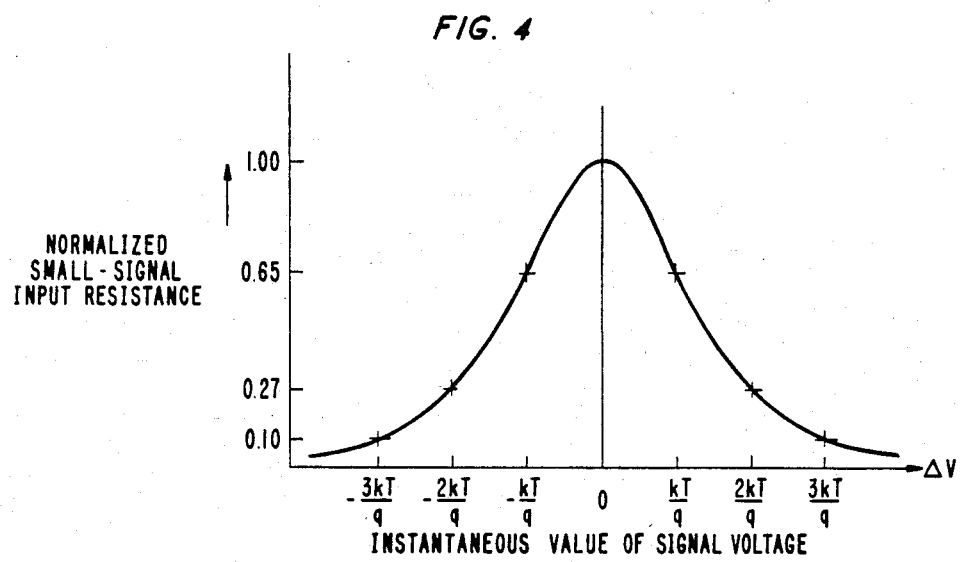
FIG. 4 is a graphical depiction of the small signal resistance provided by elements of the input biasing circuit of FIG. 3 as a function of instantaneous signal voltage level provided by a microphone of the capacitance type.

Using the above equations for current flow in a diode, it is possible to calculate the small-signal input resistance between input IN1 and ground as a function of the instantaneous AC signal input voltage from microphone 100. A plot of this relationship is shown in FIG. 4. For small AC signal voltages ($< \pm kT/q$), the small-signal input resistance is relatively constant. However, if the instantaneous signal voltage becomes large ($> \pm 2 kT/q$), the small-signal resistance decreases exponentially with instantaneous signal voltage magnitude. Thus any unwanted charge on the input node IN1 (FIGS. 1, 2, and 3) due to large-amplitude transient signals from microphone 100 is quickly dispersed, rapidly restoring quiescent bias conditions. Thus this circuit provides a large input resistance (and hence good low-frequency response) for small signals, while providing a small input resistance, progressive signal limiting, and fast overload recovery for large signals.

What is claimed is:

1. A high impedance input coupling circuit for biasing a unipolar transistor having a gate electrode, a drain electrode and a source electrode, the high impedance input coupling circuit providing bias for the gate electrode of the unipolar transistor and comprising:

a first diode string including at least a first and a second diode serially connected between a constant current source and a voltage reference source, the common connection of the first and second diodes also being commonly connected to the gate electrode; and a second diode string including at least a third and a fourth diode serially connected between the constant current source and the voltage reference source and in parallel with the first diode string, and having an additive low resistance current path therewith, input to the high impedance input coupling circuit and to the gate of the unipolar transistor being provided at the common connection of the first and second diodes and at the drain electrode, the drain electrode being connected directly to a common ground potential, the combination of the first and second diode strings providing a high value resistance to small-signal variations presented across the gate electrode and drain electrode of the unipolar transistor.

2. The high impedance input circuit of claim 1 wherein the combination of the first and second diode strings causes the high value resistance to proportionally decrease in value with progressively increasing signal variation levels presented across the gate electrode and drain electrode of unipolar transistor.

3. The high impedance input circuit of claim 1 wherein the junction area of the first diode is equal to that of the second diode and the junction area of the third diode is equal to that of the fourth diode, the junction areas of the third and fourth diodes being considerably greater than the junction areas of the first and second diodes.

4. The integrated circuit of claim 3 wherein the high impedance input circuit is a monolithic integrated circuit.

5. In an integrated circuit, a high impedance input coupling circuit for biasing a unipolar transistor having a gate electrode, a drain electrode and a source electrode, the high impedance input coupling circuit providing bias for the gate electrode of the unipolar transistor and comprising:

a first diode string including at least a first and a second diode serially connected between a constant current source and a voltage reference source, the common connection of the first and second diodes also being commonly connected to the gate electrode; and a second diode string including at least a third and a fourth diode serially connected between the constant current source and the voltage reference source and in parallel with the first diode string, and having an additive low resistance current path therewith, input to the high impedance input coupling circuit and to the gate of the unipolar transistor being provided at the common connection of the first and second diodes and at the drain electrode, the drain electrode being connected directly to a common ground potential, the combination of the first and second diode strings providing a high value resistance to small-signal variations presented across the gate electrode and drain electrode of the unipolar transistor, the high value resistance proportionally decreasing in value with progressively increasing signal variation levels across the gate electrode and drain electrode of the unipolar transistor.

6. A high impedance input coupling circuit for an integrated circuit comprising:

a first diode string including at least a first and a second diode serially connected between a constant current source and a voltage reference source;

a unipolar transistor having a gate electrode, a drain electrode and a source electrode, the gate electrode and drain electrode respectively providing input terminals for the high impedance input coupling circuit, and the gate electrode being biased by the combination of the first diode string and the constant current source; and a second diode string including at least a third and a fourth diode serially connected between the constant current source and the voltage reference source and in parallel with the first diode string, and having an additive low resistance current path therewith, the gate electrode of the unipolar transistor also being commonly connected at the common connection of the first and second diodes, and the drain electrode being connected directly to a common ground potential, the combination of the first and second diode strings providing a high value resistance to small-signal variations presented across the gate electrode and drain electrode of the unipolar transistor.

7. The high impedance input circuit of claim 6 wherein the combination of the first and second diode strings causes the high value resistance to proportionally decrease in value with progressively increasing signal variation levels across the unipolar transistor.

8. In an integrated circuit, a high impedance input circuit for coupling signal variations from a highly capacitive source, the high impedance input circuit comprising:
   a gain providing circuit for amplifying the signal variations from the highly capacitive source;
   a first coupling circuit for coupling the signal variations from the highly capacitive source to the gain providing circuit, the first coupling circuit providing a high value resistance to small-signal variations presented thereto and a lower value resistance to high-signal variations presented thereto, the high value resistance proportionally decreasing in value with increasing signal variation levels; and
   a second coupling circuit mirroring the first coupling circuit for coupling a capacitance reactance proportioned to that of the highly capacitive source to the gain providing circuit, the combination of the first and second coupling circuits providing the signal variations from the highly capacitive source to the gain providing circuit substantially free of supply noise variations and direct current voltage drifts.

9. The integrated circuit of claim 8 wherein the high impedance input circuit is a monolithic integrated circuit.

* * * * *